United States Patent [19]

Enomoto et al.

[11] Patent Number: 4,664,946

[45] Date of Patent: May 12, 1987

[54] SILICON CARBIDE SUBSTRATES AND A METHOD OF PRODUCING THE SAME

[75] Inventors: Ryo Enomoto, Ohgaki; Hidetoshi Yamauchi, Anpachi; Shoji Tanikawa, Ohgaki, all of Japan

[73] Assignee: Ibiden Co., Ltd., Japan

[21] Appl. No.: 858,834

[22] Filed: Apr. 29, 1986

Related U.S. Application Data

[62] Continuation of Ser. No. 676,263, Nov. 29, 1984, abandoned, which is a division of Ser. No. 451,940, Dec. 21, 1982, Pat. No. 4,499,147.

[30] Foreign Application Priority Data

Dec. 28, 1981 [JP] Japan ............................. 56-209991
Dec. 28, 1981 [JP] Japan ............................. 56-209992
Mar. 29, 1982 [JP] Japan ............................. 57-48958

[51] Int. Cl.⁴ ............................................. B05D 5/12
[52] U.S. Cl. ........................... 427/126.2; 427/126.4; 427/314; 427/376.2; 427/376.3; 427/399; 427/419.2; 427/419.6
[58] Field of Search ............ 427/93, 96, 126.2, 126.3, 427/126.4, 255, 255.3, 255.4, 314, 399, 376.2, 376.3, 380, 397.7, 419.2, 419.3, 419.4, 419.6; 428/428, 432, 446, 698, 702

[56] References Cited

U.S. PATENT DOCUMENTS

| | | | |
|---|---|---|---|
| 1,653,123 | 12/1927 | Rentschler | 428/698 |
| 1,653,918 | 12/1927 | Martin | 428/698 |
| 1,818,904 | 8/1931 | Martin | 428/698 |
| 1,975,069 | 10/1934 | Benner et al. | 428/698 |
| 2,874,067 | 2/1959 | Sommer et al. | 428/698 |
| 2,943,008 | 6/1960 | Saunders | 428/698 |
| 4,159,357 | 6/1979 | Grunke | 427/255 |
| 4,199,339 | 4/1980 | Grunke | 427/376.2 |

*Primary Examiner*—Sadie L. Childs
*Attorney, Agent, or Firm*—Parkhurst & Oliff

[57] ABSTRACT

This invention relates to a method of producing a silicon carbide substrate having desirable electrical insulation properties. The silicon carbide substrate is produced by applying to a surface of a silicon carbide plate a film-forming composition which consists essentially of at least one oxide or substance with produces an oxide by decomposition of an element selected from the group consisting of aluminum, phosphorus, boron, germanium, arsenic, antimony, bismuth, vanadium, zinc, lead, cadmium, sodium, potassium, lithium, beryllium, calcium, magnesium, barium and strontium and heating the silicon carbide body in an oxidizing atmosphere to form a eutectic oxide layer thereon.

24 Claims, 1 Drawing Figure

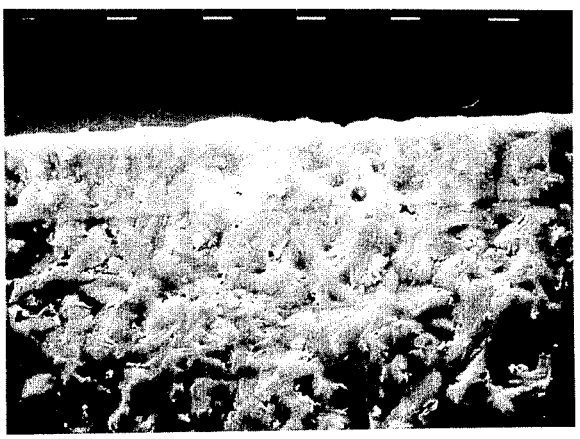

SILICON CARBIDE SUBSTRATES AND A METHOD OF PRODUCING THE SAME

This is a continuation of application Ser. No. 676,263 filed Nov. 29, 1984 (now abandoned), which in turn in a Divisional of U.S. Pat. No. 4,499,147 granted Feb. 12, 1985.

BACKGROUND OF THE INVENTION

1. Field of the Invention

This invention relates to a silicon carbide substrate usable for integrated circuits or IC packages and a method of producing the same, and more particularly to a silicon carbide substrate having an excellent electrical insulation property by closely adhering a eutectic oxide layer onto a silicon carbide plate body and a method of producing the same.

2. Description of the Prior Art

Lately, electronic components such as semiconductors and the like are strongly directed to miniaturization or large-sized integration with the advancement of electronics industrial technology. Thus, the heat release value in integrated circuits increases with the large-sized integration of the electronic component, so that the heat dissipation of the substrate for the integrated circuit becomes significant. In the electronics industry, there are known and practiced various kinds of the substrates. Particularly, alumina sintered body, glass and the like are used for applications requiring high reliability. However, these substrates usually used are low in the thermal conductivity and poor in the heat dissipation, so that they have difficulty in solving problems due to heat accumulation, which is a very serious obstacle to inhibiting the large-sized integration of the electronic component.

As a material of the substrate solving the above problems, there have hitherto been examined beryllia, porcelain enamel and the like. However, the beryllia has a drawback that the production and handling are difficult owing to its toxicity. While, the porcelain enamel has drawbacks that the thermal expansion coefficient is large because a metallic plate is used as a substrate, and that frits are apt to take a dogbone structure, and that not only the cutting after the printing is difficult but also the laser trimming cannot be performed because cracks occur in the porcelain enamel at the cutting surface.

In any case, the conventionally known substrates have various drawbacks as previously mentioned.

The inventors have made various studies with respect to the provision of substrates capable of solving the above mentioned drawbacks, namely, substrates having a high thermal conductivity and very excellent properties usable for large-sized integrated circuit or IC package and found that the silicon carbide sintered body has high thermal conductivity, high thermal shock resistance, and high strength at both room temperature and elevated temperatures as compared with the conventional alumina sintered body (hereinafter referred to as alumina substrate) widely used as a substrate, and that the alumina substrate is largely different from a silicon chip usually used for the integrated circuit in the thermal expansion coefficient so that it is difficult to directly adhere the silicon chip to the alumina substrate, while the silicon carbide sintered body has a thermal expansion coefficient substantially equal to that of the silicon chip so that it can directly be adhered with the silicon chip. However, the silicon carbide sintered body has semiconductive properties but has no electrical insulation property, so that it is not yet used as a substrate up to now.

With the foregoing in mind, the inventors have made studies with respect to a method of imparting the electrical insulation property to the silicon carbide plate body in order to apply this plate body as a substrate to large-sized integrated circuits or IC packages.

In order to impart the electrical insulation property to the silicon carbide plate body, the inventors have attempted a method wherein an electrically insulating material such as vitreous substance composed of oxide or the like is applied and fused to the surface of the silicon carbide plate body to form an electrically insulating film, and a method wherein the silicon carbide plate body is oxidized to produce an electrically insulating film of silicon dioxide on the surface of the plate body. In the former method, however, the wettability and adherence between the silicon carbide plate body and the vitreous substance are poor, so that the film is apt to peel off from the plate body. Furthermore, defects of pinholes, cracking and the like are apt to be produced, so that the reliability is very low. On the other hand, according to the latter method, it is difficult to uniformly oxidize the surface of the silicon carbide plate body and the thickness of the resulting oxide film is apt to become nonuniform. Furthermore, the resulting silicon dioxide mainly produces cristobalite crystal, so that it is difficult to provide a uniform and dense film having a stable electrical insulation property.

In this connection, the inventors have made further studies with respect to the method for the formation of films solving the aforementioned drawbacks and having a stable electrical insulation property and found out that when the electrically insulating oxide film is formed on the surface of the silicon carbide plate body, $SiO_2$ produced by surface oxidation of the siicon carbide plate body can form a eutectic oxide layer having a very good adherence and a high reliable electrical insulation property together with the oxide film, and as a result the invention has been accomplished.

SUMMARY OF THE INVENTION

It is an object of the invention to provide a silicon carbide substrate provided at its surface with a eutectic oxide layer having a good adherence and a high reliability for the electrical insulation property.

The object of the invention can be achieved by closely adhering to the surface of the silicon carbide plate body a eutectic oxide layer consisting essentialy of $SiO_2$ and an oxide of at least one element selected from aluminum, phosphorus, boron, germanium, arsenic, antimony, bismuth, vanadium, zinc, lead, cadmium, sodium, potassium, lithium, beryllium, calcium, magnesium, barium and strontium.

BRIEF DESCRIPTION OF THE DRAWING

A single FIGURE is a scanning-type electron photomicrograph (830×magnification) showing a longitudinal section of the silicon carbide substrate obtained in Example 5.

DETAILED DESCRIPTION OF THE INVENTION

According to the invention, the silicon carbide plate body is provided at its surface with the eutectic oxide layer consisting essentially of $SiO_2$ and the oxide of at least one element selected from Al, P, B, Ge, As, Sb, Bi, V, Zn, Pb, Cd, Na, K, Li, Be, Ca, Mg, Ba and Sr as an insulating film. In this case, it is necessary that the eutectic oxide layer contains $SiO_2$ produced by oxidation of silicon carbide mainly constituting the substrate. Because, $SiO_2$ produced by the oxidation of silicon carbide together with at least one oxide as described above forms a very uniform and dense eutectic oxide layer not having any pinholes, crack and the like and considerably improves the adherence between the eutectic oxide layer and the silicon carbide plate body.

The mechanism of improving the adherence between the silicon carbide plate body and the eutectic oxide layer by the oxidation of the plate body is attributed to the fact that impurities such as free carbon adhered to the surface of the plate body and the like are removed by the oxidation of the plate body so as not to include foreign matters between the plate body and the eutectic oxide layer and also the surface of the silicon carbide plate body is changed into a microscopically roughened state by the oxidation to considerably increased an adhesive surface area to the eutectic oxide layer and to form a transition layer having an entanglement structure of the eutectic oxide layer with the plate body.

According to the invention, it is preferable that $SiO_2$ included in the eutectic oxide layer contains at least 30% by weight of $SiO_2$ produced by the oxidation of silicon carbide mainly constituting the substrate. When the content of $SiO_2$ produced by the oxidation of silicon carbide is less than 30% by weight, not only it is difficult to obtain a uniform eutectic oxide layer without causing defects of pinholes and the like, but also the formation of the transition layer between the plate body and the eutectic oxide layer is insufficient and the adherence is degraded.

The oxide other than $SiO_2$ contained in the eutectic oxide layer includes $Al_2O_3$, $P_2O_5$, $B_2O_3$, $GeO_2$, $As_2O_3$, $Sb_2O_3$, $Bi_2O_3$, $V_2O_5$, ZnO, PbO, $Pb_3O_4$, $PbO_2$, CdO, $Na_2O$, $K_2O$, $Li_2O$, BeO, CaO, MgO, BaO and SrO. Among these oxides, the eutectic oxide layer preferable contains $Al_2O_3$ in addition to $SiO_2$, because $Al_2O_3$ serves to prevent the formation of cristobalite from $SiO_2$ produced by the oxidation of the silicon carbide plate body and can form a uniform and dense eutectic oxide layer having a stable electrical insulation property together with $SiO_2$ produced by the oxidation of the plate body. In the latter case, the eutectic oxide layer has a molar ratio of $Al_2O_3$ to $SiO_2$ of 0.024–1.8, preferably 0.05–1.0. When the molar ratio of $Al_2O_3/SiO_2$ is less than 0.024, the effect of preventing the formation of cristobalite from $SiO_2$ produced by the oxidation of the plate body is insufficient and a uniform and dense eutectic oxide layer cannot be obtained, while when the molar ratio of $Al_2O_3/SiO_2$ exceeds 1.8, not only is the melting point of the eutectic oxide layer too high and it is difficult to make the thickness of the eutectic oxide layer uniform, but also the difference in the thermal expansion coefficient between the eutectic oxide layer and the plate body becomes large and the eutectic oxide layer is apt to peel off from the plate body.

According to the invention, it is preferable that the thickness of the eutectic oxide layer is within a range of 0.5–100 μm, preferably 1.0–60 μm. When the thickness is less than 0.5 μm, it is difficult to impart the stable electrical insulation property and the reliability is poor. While, when the thickness exceeds 100 μm, the difference in the thermal expansion coefficient between the eutectic oxide layer and the plate body becomes considerably large and consequently the eutectic oxide layer is not only apt to peel off from the plate body but also the thermal conductivity is considerably deteriorated.

In the preferred embodiment of the invention, at least one oxide of alkali metals and alkaline earth metals is further contained in the eutectic oxide layer consisting of $SiO_2$ and $Al_2O_3$, whereby the melting point of the resulting eutectic oxide layer is dropped to promote the formation of the eutectic with $SiO_2$ produced by the oxidation of the plate body and the adherence between the eutectic oxide layer and the plate body is improved. In this case, the total content of the alkali metal oxide and alkaline earth metal oxide is not more than 60% as a mole fraction for oxide and particularly not more than 30% when requiring the higher electrical insulation property.

The alkali metal oxide includes, for example, $Li_2O$, $K_2O$ and the like. The alkaline earth metal oxide includes, for example, MgO, CaO, BeO, BaO and the like, among which MgO and CaO are most preferable.

In order to advance the miniaturization of electronic components and improve the heat dissipation, it is preferable to make the thickness of the silicon carbide plate body as thin as possible. According to the invention, therefore, the thickness of the plate body is within a range of 0.1–30 mm. When the thickness of the plate body is less than 0.1 mm, the strength of the plate body itself becomes too low for use as a substrate, while when the thickness exceeds 30 mm, not only the miniaturization of electronic components is difficult, but also the cost required for the substrate becomes high.

Then, the invention will be described in detail with respect to the production of the silicon carbide substrate.

In a first method of the invention, a film-forming composition consisting essentially of at least one element or compound selected from Al, P, B, Ge, As, Sb, Bi, V, Zn, Pb, Cd, Na, K, Li, Be, Ca, Mg, Ba, Sr and their compounds is first applied to a surface of a silicon carbide plate body and then heated in an oxidizing atmosphere, during which the surface of the plate body is oxidized with the oxidation of the film-forming composition. Thereby, a eutectic oxide layer consisting of the oxide produced from the film-forming composition and $SiO_2$ produced by the oxidation of the plate body is closely adhered to the surface of the plate body to produce a silicon carbide substrate having an improved electrical insulation property.

In a second method of the invention, a surface of a silicon carbide plate body is first oxidized in an oxidizing atmosphere. Thereafter, a coating composition consisting essentially of at least one element or compound selected from Al, Si, P, B, Ge, As, Sb, Bi, V, Zn, Pb, Cd, Na, K, Li, Be, Ca, Mg, Ba, Sr and their compounds is applied to the oxidized surface of the plate body and again heated, whereby a uniform and dense eutectic oxide layer imparting an excellent electrical insulation property is formed on the surface of the plate body.

In order to further increase the thickness of the eutectic oxide layer obtained by the first method and impart a higher reliability thereto, an additional coating composition containing at least two substances selected from Al, Si, P, B, Ge, As, Sb, Bi, V, Zn, Pb, Cd, Na, K, Li, Be, Ca, Mg, Ba, Sr and their compounds is applied to the surface of the eutectic oxide layer obtained by the first method and is heated to form a deposit layer thereon, whereby a new eutectic oxide layer consisting of the previously formed eutectic oxide layer and the deposit layer is obtained as a third method of the invention.

According to the invention, when the silicon carbide plate body is heated in an oxidizing atmosphere, the surface of the plate body is changed into a microscopically roughened state by the surface oxidation of the plate body, whereby the adhesive surface area of the eutectic oxide layer can considerably be increased and the eutectic oxide layer can firmly be joined to the silicon carbide plate body through a transition layer having an entaglement structure between the plate body and the eutectic oxide layer to produce a silicon carbide substrate having an excellent electrical insulation property. Furthermore, $SiO_2$ produced by the oxidation of the plate body coexists with the oxide produced from the film-forming composition without forming cristobalite of $SiO_2$ or the oxide produced from the coating composition to obtain a highly dense eutectic oxide layer being relatively thick.

According to the first and third methods, it is preferable that at least 30% by weight of $SiO_2$ included in the eutectic oxide layer is one produced through the surface oxidation of the silicon carbide plate body. When the content of $SiO_2$ produced by the oxidation of the plate body is less than 30% by weight, the formation of the transition layer is insufficient and the adherence between the plate body and the eutectic oxide layer is deteriorated.

If it is intended to require the eutectic oxide layer having a higher reliability, it is particularly effective to use a film-forming composition consisting essentially of aluminum or its compound capable of giving aluminum oxide under the oxidizing atmosphere for the formation of eutectic oxide layer because the aluminum oxide develops a remarkable effect for preventing the formation of cristobalite from $SiO_2$ produced by the oxidation of the plate body. Preferably, aluminum or its compound is applied in an amount of 0.001-2.9 mg/cm$^2$, preferably 0.003-1.2 mg/cm$^2$ as $Al_2O_3$.

As aluminum or its compound, use may be made of at least one substance selected from alumina sol, metallic aluminum, aluminum-containing alloy, aluminum oxide, aluminum hydroxide, aluminate, aluminosilicate, aluminum phosphate and aluminum acetate. Among them, alumina sol is preferably used because it is very fine and can give aluminum oxide having a high reactivity in the oxidizing atmosphere.

When the eutectic oxide layer is formed on the surface of the silicon carbide plate body after the application of the film-forming composition consisting essentially of aluminum or its compound, it is preferable that the film-forming composition further contains at least one of alkali metals, alkaline earth metals and compounds thereof in order to drop the melting point of the eutectic oxide layer for promoting the formation of eutectic and to improve the adherence between the eutectic oxide layer and the plate body. In this case, the alkali metal, alkaline earth metal or compound thereof gives an oxide of alkali metal or alkaline earth metal during the heating in the oxidizing atmosphere for the formation of the eutectic oxide layer, and is applied in an amount of not more than 5 mg/cm$^2$, preferably not more than 2.5 mg/cm$^2$ as an oxide. When the amount exceeds 5 mg/cm$^2$, the electrical insulation property of the resulting eutectic oxide layer is deteriorated. As the alkali metal, alkaline earth metal or its compound, use may be made of Li, Na, K, Be, Mg, Ca, Ba and compounds thereof.

As the application of the film-forming composition, use may be made of various methods such as screen printing, immersing, spraying, brushing and the like.

In the invention, the silicon carbide plate body is heated in an oxidizing atmosphere at a temperature of 750°-1,650° C. for at least 10 minutes. When the heating temperature is lower than 750° C., the rate of oxidation becomes slow and it is difficult to efficiently oxidize the silicon carbide plate body, while when the heating temperature exceeds 1,650° C., the oxidation rate is very rapid and it is not only difficult to control the amount of $SiO_2$ produced, but also air bubbles are produced between the eutectic oxide layer and the silicon carbide plate body by CO gas or the like, by-products of the oxidation of silicon carbide, thereby degrading the adherence in the first and third methods. Moreover, a best result can be obtained when the heating temperature is within a range of 900°-1,450° C. On the other hand, when the heating time is shorter than 10 minutes, it is difficult to sufficiently oxidize the silicon carbide plate body and to form the eutectic oxide layer having a sufficiently high reliability.

In this way, the eutectic oxide layer having a thickness of 0.5-100 μm, preferably 1.0-60 μm is formed on the surface of the silicon carbide plate body, whereby a silicon carbide substrate having a stable electrical insulation property and a high thermal conductivity is obtained. When the thickness of the eutectic oxide layer is less than 0.5 μm, it is difficult to impart a stable electrical insulation property and the reliability is poor, while when the thickness exceeds 100 μm, not only the formation of the eutectic oxide layer takes a very long time, but also the eutectic oxide layer is apt to peel off from the silicon carbide plate body due to the great difference in the thermal expansion coefficient therebetween and the thermal conductivity is considerably deteriorated.

According to the first and third methods, if it is intended to produce a eutectic oxide layer having a relatively thick thickness in a short time, a silicon-containing compound can be added to the film-forming composition. Such a silicon-containing compound is capable of giving an oxide of silicon in the oxidizing atmosphere for the formation of the eutectic oxide layer and includes, for example, silica sol, metallic silicon, silicon-containing alloy, silicon dioxide, silicon monoxide and silicates.

According to the third method of the invention, the thickness of the deposit layer is within a range of 0.6-80 μm, preferably 1-50 μm. When the thickness of the deposite layer is less than 0.6 μm, it is difficult to stably improve the electrical insulation property of the silicon carbide substrate, while when the thickness exceeds 80 μm, not only the new eutectic oxide layer is apt to peel off from the silicon carbide plate body due to the great difference in the thermal expansion coefficient therebetween, but also the thermal conductivity is considerably deteriorated.

The application of the coating composition may be performed in the same manner as described in the application of the film-forming composition.

In the heating according to the second and third methods, a non-oxidizing atmosphere is advantageously used for preventing the formation of air bubbles in the deposit layer from CO gas produced by the oxidation of the silicon carbide substrate during the deposition. Further, the heating temperature is preferable within a range of 300°-1,200° C. When the heating temperature is lower than 300° C., it is difficult to deposit the deposit layer on the surface of the previously formed eutectic oxide layer, while when the heating temperature exceeds 1,200° C., the viscosity of oxides produced from the coating composition considerably lowers and it is difficult to form the deposit layer having a uniform thickness.

Moreover, when the silicon carbide plate body is oxidized by heating in the oxidizing atmosphere, it is advantageous that the oxidizing atmosphere further contains steam. Because, the presence of the steam can efficiently oxidize the surface of the plate body even at a relatively low temperature.

The following examples are given in illustration of the invention and are not intended as limitations thereof.

EXAMPLE 1

As a silicon carbide plate body, there was used a non-pressurized sintered body containing 1.0% by weight of boron and 2.0% by weight of free carbon and having a density of 3.1 g/cm$^3$ and a size of 50×20×2 mm, which was subjected to a polishing and a surface finishing with a whetstone #200 and degreased by boiling in acetone.

The thus treated silicon carbide plate body was immersed in a suspension of 2.0 g of calcium chloride dissolved in 100 ml of an aqueous solution of 1% by weight of alumina sol and then dried in a drier at 110° C. for 1 hour. Thus, about 0.13 mg/cm$^2$ of alumina sol as an aluminum oxide and about 0.25 mg/cm$^3$ of calcium chloride as a calcium oxide were existent on the surface of the silicon carbide plate body, respectively.

Then, the silicon carbide plate body was placed in a tubular furnace having an inner diameter of 40 mm and subjected to an oxidation treatment at 1,400° C. for 3 hours, wherein an oxygen gas was fed into the furnace at a rate of 1 l/min.

The resulting eutectic oxide layer was transparent, vitreous and smooth on its surface and had a thickness of about 3 μm and no defects of pinholes, microcracks and the like.

A silicon carbide substrate provided with the above eutectic oxide layer and an insulation resistance of 3×10$^{12}$ Ω at an applied voltage of 100 V as measured according to JIS C-5012-7.3 and a dielectric strength of 1.7 KV as measured according to JIS C-2110-8.3.

Moreover, the eutectic oxide layer had a molar ratio of Al$_2$O$_3$/SiO$_2$ of 0.27 and was confirmed by an X-ray diffractometry to contain a slight amount of cristobalite crystal.

EXAMPLE 2

The same procedure as described in Example 1 was repeated, except that a mixture of steam and oxygen with a mixing ratio of about 1:1 was used as the oxidizing gas, to obtain a silicon carbide substrate provided with a eutectic oxide layer.

The resulting eutectic oxide layer had a molar ratio of Al$_2$O$_3$/SiO$_2$ of 0.15 and a thickness of about 5 μm and was very smooth on its surface without defects. Further, the silicon carbide substrate had an insulation resistance of 5×10$^{12}$ Ω at an applied voltage of 100 V and a dielectric strength of 3.0 KV.

EXAMPLE 3

The same procedure as described in Example 1 was repeated, except that the temperature and time in the oxidation treatment were changed as shown in the following Table 1, to obtain a silicon carbide substrate provided with a eutectic oxide layer having properties as shown in Table 1.

TABLE 1

| | Oxidation Conditions | | Silicon carbide substrate | | | |
|---|---|---|---|---|---|---|
| | | | Eutectic oxide layer | | Insulation | Dielectric |
| Run No. | Temperature (°C.) | Time (hr) | Molar ratio of Al$_2$O$_3$/SiO$_2$ | Thickness (μm) | resistance (Ω) | strength (KV) |
| 1 | 1,100 | 10 | 0.49 | 1.5 | 3 × 10$^{12}$ | 0.8 |
| 2 | 1,550 | 2 | 0.11 | 6 | 6 × 10$^{11}$ | 1.3 |
| 3 | 1,400 | 1 | 0.34 | 2 | 1 × 10$^{12}$ | 1.2 |

EXAMPLE 4

The same procedure as described in Example 1 was repeated, except that an additive as shown in the following Table 2 was added to the aqueous solution of alumina sol instead of calcium chloride and the oxidation treatment was carried out at a temperature of 1,400° C. for 3 hours, to obtain a silicon carbide substrate provided with a eutectic oxide layer having properties as shown in Table 2.

TABLE 2

| | | | Silicon carbide substrate | | | |
|---|---|---|---|---|---|---|
| | | | Eutectic oxide layer | | Insulation | Dielectric |
| Run No. | Additive | amount as oxide (mg/cm$^2$) | molar ratio of Al$_2$O$_3$/SiO$_2$ | Thickness (μm) | resistance (Ω) | strength (KV) |
| 1 | MgCl$_2$ | 0.36 | 0.27 | 2.5 | 8 × 10$^{11}$ | 1.5 |
| 2 | K$_2$CO$_3$ | 0.19 | 0.27 | 3.5 | 6 × 10$^{11}$ | 1.4 |
| 3 | ZnCl$_2$ | 0.30 | 0.26 | 4.0 | 4 × 10$^{13}$ | 2.3 |

COMPARATIVE EXAMPLE 1

The same silicon carbide plate body as used in Example 1 after the surface finishing was placed in the tubular furnace and oxidized in the same manner as described in Example 1.

The thus obtained oxide layer was white-opaque and had an insulation resistance of 2×10$^7$ Ω at an applied voltage of 100 V, which was very unsuitable as a substrate material.

Moreover, it was confirmed by an X-ray diffractometry that the oxide layer consisted mainly of cristobalite crystal.

EXAMPLE 5

The same silicon carbide plate body as used in Example 1 was immersed in a suspension of 1.6 g of calcium chloride dissolved in 100 ml of an aqueous solution of 1% by weight of alumina sol and then oxidized in the same manner as described in Example 1 to form a eutectic oxide layer containing 0.20 mg/cm² of calcium oxide and 0.13 mg/cm² aluminum oxide on the surface of the plate body.

The resulting eutectic oxide layer was transparent, vitreous and smooth on its surface and had a molar ratio of $Al_2O_3/SiO_2$ of 0.3 and a thickness of about 2.7 μm.

Then, a coating composition consisting essentially of $SiO_2$, $B_2O_3$ and ZnO was applied to the eutectic oxide layer by screen printing method and subjected to a drying treatment at 110° C. for 1.5 hours two times.

Thereafter, the silicon carbide substrate covered with the coating composition was placed in a firing furnace, subjected to a firing treatment wherein the temperature was raised up to 650° C. at a rate of 10° C./min and held at this maximum temperature for 1 hour, and then cooled to form a deposit layer on the eutectic oxide layer. In this case, the firing was performed in air up to 300° C. and in an argon gas atmosphere up to 650° C.

The thus obtained new eutectic oxide layer inclusive of the deposit layer had a thickness of about 18 μm and a very smooth surface and no defects of pinholes, microcracks and the like. The thickness of the deposit layer was about 15 μm.

The finally obtained silicon carbide substrate had an insulation resistance of $2 \times 10^{13}$ Ω at an applied voltage of 25 V and a dielectric strength of 2.1 KV.

From the scanning-type electron photomicrograph (830×magnification) showing the longitudinal section of this silicon carbide substrate, it can be seen that the silicon carbide plate body and the new eutectic oxide layer are firmly joined with each other through a transition layer having an entangelement structure of the plate body and the eutectic oxide layer.

EXAMPLE 6

The same procedure as described in Example 5 was repeated, except that a mixture of steam and oxygen with a mixing ratio of about 1:1 was used as an oxidizing atmosphere in the oxidation treatment, to obtain a silicon carbide substrate provided with a eutectic oxide layer inclusive of a deposit layer.

The eutectic oxide layer had a thickness of about 20 μm and a very smooth surface without defects. Moreover, the portion of the eutectic oxide layer other than the deposit layer had a thickness of about 4.5 μm and a molar ratio of $Al_2O_3/SiO_2$ of 0.14.

The silicon carbide substrate had an insulation resistance of $6 \times 10^{13}$ Ω at an applied voltage of 25 V and a dielectric strength of 2.8 KV.

EXAMPLE 7

The same procedure as described in Example 5 was repeated, except that only the temperature and time in the oxidation treatment were changed as shown in the following Table 3, to obtain a silicon carbide substrate provided with a eutectic oxide layer inclusive of a deposit layer having properties as shown in Table 3.

TABLE 3

| | Oxidation conditions | | Silicon carbide substrate | | | | |
|---|---|---|---|---|---|---|---|
| | | | Eutectic oxide layer | | | | |
| Run No. | Temperature (°C.) | Time (hr) | Molar ratio of $Al_2O_3/SiO_2$ | Thickness (μm) | Total thickness inclusive of deposit layer (μm) | Insulation resistance (Ω) | Dielectric strength (KV) |
| 1 | 1,100 | 10 | 0.45 | 1.3 | 16 | $1 \times 10^{13}$ | 1.9 |
| 2 | 1,550 | 2 | 0.10 | 5.0 | 20 | $8 \times 10^{13}$ | 3.0 |
| 3 | 1,400 | 1 | 0.40 | 1.8 | 17 | $2 \times 10^{13}$ | 2.0 |

EXAMPLE 8

The same procedure as described in Example 5 was repeated, except that an additive(s) as shown in the following Table 4 added to 100 ml of an aqueous solution of 1% by weight of alumina sol and the oxidation treatment was carried out at a temperature of 1,400° C. for 3 hours, to obtain a silicon carbide substrate provided with a eutectic oxide layer inclusive of a deposit layer having properties as shown in Table 4.

TABLE 4

| | | | | | Silicon carbide substrate | | | | |
|---|---|---|---|---|---|---|---|---|---|
| | | | | | Eutectic oxide layer | | | | |
| Run No. | Additive | amount as oxide (mg/cm²) | | | Molar ratio of $Al_2O_3/SiO_2$ | Thickness (μm) | Total thickness inclusive of deposit layer (μm) | Insulation resistance (Ω) | Dielectric strength (KV) |
| 1 | $MgCl_2$ | 0.30 | | | 0.30 | 2.3 | 17 | $2 \times 10^{13}$ | 2.0 |
| 2 | $K_2CO_3$ | 0.16 | | | 0.30 | 3.2 | 18 | $5 \times 10^{13}$ | 2.1 |
| 3 | $CaCl_2$ | 0.20 | $ZnCl_2$ | 0.24 | 0.30 | 3.6 | 19 | $5 \times 10^{13}$ | 2.2 |
| 4 | $CaCl_2$ | 0.20 | Silica sol | 0.06 | 0.20 | 4.0 | 19 | $4 \times 10^{13}$ | 2.3 |
| 5 | $CaCl_2$ | 0.20 | $PbCl_2$ | 0.30 | 0.30 | 3.3 | 18 | $5 \times 10^{13}$ | 2.2 |

EXAMPLE 9

After the completion of the oxidation treatment in the same manner as described in Example 5, a coating composition consisting essentially of $SiO_2$, BaO and PbO was applied to the eutectic oxide layer by screen printing method and dried at 100° C. for 2 hours.

Thereafter, the silicon carbide substrate covered with the coating composition was fired at 900° C. in the same manner as described in Example 5 to form a deposite layer on the eutectic oxide layer.

The eutectic oxide layer had a molar ratio of $Al_2O_3/SiO_2$ of 0.30 and a thickness of about 2.7 μm. The finally obtained silicon carbide substrate was provided with a new eutectic oxide layer inclusive of the deposite layer having a thickness of about 13 μm and had an insulation resistance of $6 \times 10^{13} \Omega$ at an applied voltage of 25 V and a dielectric strength of 2.5 KV.

EXAMPLE 10

The same procedure as described in Example 5 was repeated, except that a coating composition consisting essentially of SiO$_2$, BaO and CaO was used and the firing temperature was 1,100° C. in the firing treatment, to obtain a silicon carbide substrate provided with a new eutectic oxide layer inclusive of a deposit layer having a thickness of about 38 μm.

The eutectic oxide layer before the firing treatment had a molar ratio of Al$_2$O$_3$/SiO$_2$ of 0.30 and a thickness of about 2.7 μm. The silicon carbide substrate had an insulation resistance of $9 \times 10^{13} \Omega$ at an applied voltage of 25 V and a dielectric strength of 3.0 KV.

EXAMPLE 11

The same surface-finished silicon carbide plate body as used in Example 1 was placed in a tubular furnace and oxidized under the same conditions as described in Example 1, whereby SiO$_2$ film having a thickness of about 0.05 μm was formed on the surface of the plate body.

Then, the same coating composition as used in Example 5 was applied to the plate body having SiO$_2$ film and then fired under the same conditions as described in Example 5 to obtain a silicon carbide substrate provided with a eutectic oxide layer consisting of SiO$_2$ film and deposit layer.

The eutectic oxide layer had a thickness of about 30 μm and no defects of pinholes, microcracks and the like and was very smooth in its surface and very excellent in the thermal shock resistance.

The silicon carbide substrate had an insulation resistance of $3 \times 10^{12} \Omega$ at an applied voltage of 100 V and a dielectric resistance of 0.8 KV.

EXAMPLE 12

The same degreased silicon carbide plate body as used in Example 1 was immersed in a 40% aqueous solution of nitric acid and boiled therein for 20 hours to perform surface oxidation of the plate body, whereby SiO$_2$ film was formed on the surface of the plate body.

Then, the same coating composition as used in Example 5 was applied to the plate body having SiO$_2$ film and then fired under the same conditions as described in Example 5 to obtain a silicon carbide substrate povided with a eutectic oxide layer consisting of SiO$_2$ film and deposit layer.

The eutectic oxide layer had a thickness of about 30 μm and no defects of pinholes, microcracks and the like. Further, the silicon carbide substrate had an insulation resistance of $9 \times 10^{10} \Omega$ at an applied voltage of 100 V and a dielectric strength of 0.5 KV.

COMPARATIVE EXAMPLE 2

The same coating composition as used in Example 5 was applied to the same degreased silicon carbide plate body as used in Example 1 without oxidation and then fired under the same conditions as described in Example 5 to form a deposit layer on the plate body.

The deposit layer was poor in the adherence to the plate body, contained may protruding portions, and was apt to peel off from the plate body.

What is claimed is:

1. A method of producing a silicon carbide substrate having excellent electrical insulation properties, comprising the steps of:
   (a) applying to a surface of a silicon carbide plate body a film-forming composition consisting essentially of alumina sol and at least one oxide, or at least one substance which produces an oxide by decomposition, of at least one element selected from the group consisting of aluminum, phosphorus, boron, germanium, arsenic, antimony, bismuth, vanadium, zinc, lead, cadmium, sodium, potassium, lithium, beryllium, calcium, magnesium, barium and strontium; and
   (b) heating said silicon carbide plate body in an oxidizing atmosphere to form a eutectic oxide layer thereon, said eutectic oxide layer comprising SiO$_2$ produced by oxidation of silicon carbide in said silicon carbide plate body and an oxide produced from said film-forming composition.

2. A method of producing a silicon carbide substrate having excellent electrical insulation properties, comprising the steps of:
   (a) oxidizing a silicon carbide plate body to form a SiO$_2$ film thereon;
   (b) applying to said SiO$_2$ film a coating composition consisting essentially of alumina sol and at least one oxide, or at least one substance which produces an oxide by decomposition, of at least one element selected from the group consisting of aluminum, silicon, phosphorus, boron, germanium, arsenic, antimony, bismuth, vanadium, zinc, lead, cadmium, sodium, potassium, lithium, beryllium, calcium, magnesium, barium and strontium; and
   (c) heating said silicon carbide plate body covered with said coating composition to form a eutectic oxide layer thereon, said eutectic oxide layer comprising said SiO$_2$ film and an oxide produced from said coating composition.

3. The method according to claim 1, wherein said method further comprises the steps of:
   (c) applying to said eutectic oxide layer an additional coating composition consisting essentially of at least two elements or compounds selected from the group consisting of aluminum, silicon, phosphorus, boron, germanium, arsenic, antimony, bismuth, vanadium, zinc, lead, cadmium, sodium, potassium, lithium, beryllium, calcium, magnesium, barium and strontium; and
   (d) heating said silicon carbide plate body covered with said additional coating composition to form a modified eutectic oxide layer thereon, said modified eutectic oxide layer comprising said eutectic oxide layer and a deposit layer produced from said additional coating composition.

4. The method according to claim 2, wherein said method further comprises the steps of:
   (d) applying to said eutectic oxide layer an additional coating composition consisting essentially of at least two elements or compounds selected from the group consisting of aluminum, silicon, phosphorus, boron, germanium, arsenic, antimony, bismuth, vanadium, zinc, lead, cadmium, sodium, potassium, lithium, beryllium, calcium, magnesium, barium and strontium; and
   (e) heating said silicon carbide plate body covered with said additional coating composition to form a modified eutectic oxide layer thereon, said modified eutectic oxide layer comprising said eutectic oxide layer and a deposit layer produced from said additional coating composition.

5. The method according to claim 1, wherein when said at least one element is aluminum, said oxide or substance is selected from the group consisting of, aluminum oxide, aluminum hydroxide, aluminate, aluminosilicate, aluminum phosphate and aluminum acetate.

6. The method according to claim 5, wherein said aluminum substance is aluminum oxide, said aluminum oxide is applied to an amount of 0.004–2.9 mg/cm$^2$.

7. The method according to claim 1, wherein said oxidation is carried out at a temperature of 750°–1,650° C. for at least 10 minutes.

8. The method according to claim 1, wherein said eutectic oxide film has a thickness of 0.5–100 μm.

9. The method according to claim 2, wherein said heating is carried out at a temperature of 300°–1,200° C.

10. The method according to claim 3, wherein said deposit layer has a thickness of 0.6–80 μm.

11. A method of producing a silicon carbide substrate having excellent electrical insulation properties, comprising the steps of:
(a) applying to a surface of a silicon carbide plate body a film-forming composition consisting essentially of at least one substance which produces an oxide of aluminum, said substance being selected from the group consisting of alumina sol, aluminum hydroxide, aluminate, aluminosilicate, aluminum phosphate and aluminum acetate; and
(b) heating said silicon carbide plate body in an oxidizing atmosphere to form a eutectic oxide layer thereon, said eutectic oxide layer comprising SiO$_2$ produced by oxidation of silicon carbide in said silicon carbide plate body and aluminum oxide.

12. The method according to claim 2, wherein said oxidation is carried out at a temperature of 750°–1,650° C. for at least 10 minutes.

13. The method according to claim 4, wherein said deposit layer has a thickness of 0.6–80 μm.

14. A method of producing a silicon carbide substrate having excellent electrical insulation properties, comprising the steps of:
(a) applying to a surface of a silicon carbide plate body a film-forming composition consisting essentially of alumina sol; and
(b) heating said silicon carbide plate body in an oxidizing atmosphere to form a eutectic oxide layer thereon, said eutectic oxide layer comprising SiO$_2$ produced by oxidation of silicon carbide in said silicon carbide plate body and an oxide produced from said film-forming composition.

15. A method of producing a silicon carbide substrate having excellent electrical insulation properties, comprising the steps of:
(a) oxidizing a silicon carbide plate body to form a SiO$_2$ film thereon;
(b) applying to said SiO$_2$ film a coating composition consisting essentially of alumina sol; and
(c) heating said silicon carbide plate body covered with said coating composition to form a eutectic oxide layer thereon, said eutectic oxide layer comprising said SiO$_2$ film and an oxide produced from said coating composition.

16. The method according to claim 14, wherein said method further comprises the steps of:
(c) applying to said eutectic oxide layer an additional coating composition consisting essentially of at least two elements or compounds selected from the group consisting of aluminum, silicon, phosphorus, boron, germanium, arsenic, antimony, bismuth, vanadium, zinc, lead, cadmium, sodium, potassium, lithium, beryllium, calcium, magnesium, barium and strontium; and
(d) heating said silicon carbide plate body covered with said additional coating composition to form a modified eutectic oxide layer thereon, said modified eutectic oxide layer comprising said eutectic oxide layer and a deposit layer produced from said additional coating composition.

17. The method according to claim 15, wherein said method further comprises the steps of:
(d) applying to said eutectic oxide layer an additional coating composition consisting essentially of at least two elements or compounds selected from the group consisting of aluminum, silicon, phosphorus, boron, germanium, arsenic, antimony, bismuth, vanadium, zinc, lead, cadmium, sodium, potassium, lithium, beryllium, calcium, magnesium, barium and strontium; and
(e) heating said silicon carbide plate body covered with said additional coating composition to form a modified eutectic oxide layer thereon, said modified eutectic oxide layer comprising said eutectic oxide layer and a deposit layer produced from additional coating composition.

18. The method according to claim 14, wherein said oxidation is carried out at a temperature of 750°–1,650° C. for at least 10 minutes.

19. The method according to claim 15, wherein said oxidation is carried out at a temperature of 750°–1,650° C. for at least 10 minutes.

20. The method according to claim 14, wherein said eutectic oxide film has a thickness of 0.5–100 μm.

21. The method according to claim 15, wherein said heating is carried out at a temperature of 300°–1,200° C.

22. The method according to claim 16, wherein said deposite layer has a thickness of 0.6–80 μm.

23. The method according to claim 17, wherein said deposit layer has a thickness of 0.6–80 μm.

24. A method of producing a silicon carbide substrate having excellent electrical insulation properties, comprising the steps of:
(a) applying to a surface of a silicon carbide plate body a film-forming composition consisting essentially of at least one substance which produces an oxide of aluminum, said substance being selected from the group consisting of aluminum oxide, aluminum hydroxide, aluminate, aluminosilicate, aluminum phosphate and aluminum acetate, and at least one compound of alkali metal and alkaline earth metal, in an amount totalling not more than 5 mg/cm$^2$ as an oxide; and
(b) heating said silicon carbide plate body in an oxidizing atmosphere to form a eutectic oxide layer thereon, said eutectic oxide layer comprising SiO$_2$ produced by oxidation of silicon carbide in said silicon carbide plate body and aluminum oxide.

* * * * *